US011574096B1

(12) United States Patent
Fu et al.

(10) Patent No.: US 11,574,096 B1
(45) Date of Patent: *Feb. 7, 2023

(54) SYSTEMS AND METHODS FOR TIME SERIES SIMULATION

(71) Applicant: Wells Fargo Bank, N.A., San Francisco, CA (US)

(72) Inventors: Rao Fu, San Francisco, CA (US); Shutian Zeng, San Francisco, CA (US); Yiping Zhuang, San Francisco, CA (US); Agus Sudjianto, San Francisco, CA (US); Jie Chen, San Francisco, CA (US)

(73) Assignee: WELLS FARGO BANK, N.A., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/303,195

(22) Filed: May 24, 2021

Related U.S. Application Data

(63) Continuation of application No. 16/531,518, filed on Aug. 5, 2019, now Pat. No. 11,042,677.

(60) Provisional application No. 62/834,534, filed on Apr. 16, 2019.

(51) Int. Cl.
*G06F 30/27* (2020.01)
(52) U.S. Cl.
CPC .................... *G06F 30/27* (2020.01)
(58) Field of Classification Search
None
See application file for complete search history.

(56) References Cited

U.S. PATENT DOCUMENTS

| | | |
|---|---|---|
| 2019/0147300 A1 | 5/2019 | Bathen et al. |
| 2020/0210809 A1 | 7/2020 | Kaizerman et al. |
| 2021/0326723 A1* | 10/2021 | Kumar ............... G06N 3/0445 |
| 2022/0004846 A1* | 1/2022 | Fukuda ............... G06N 3/08 |

OTHER PUBLICATIONS

Arjovsky, Martin et al. Wasserstein GAN, Dec. 6, 2017, pp. 1-32. arXiv:1701.07875v3 2017.

Belestriero, Randall et al. Mad Max: Affine Spline Insights into Deep Learning, Nov. 11, 2018, pp. 1-56. arXiv:1805.06576v5.

(Continued)

*Primary Examiner* — Craig C Dorais
(74) *Attorney, Agent, or Firm* — Womble Bond & Dickinson

(57) ABSTRACT

Systems, apparatuses, methods, and computer program products are disclosed for generating time series. A time series simulator receives information corresponding to a request for time series. The information is formatted into input data by the time series simulator. The input data comprises at least one continuous condition. A generator network of the continuous condition generative adversarial network (CCGAN) generates the time series based directly on a value of the at least one continuous condition. The time series is provided such that the time series is at least one of (a) provided as input to an analysis pipeline or (b) received by a user computing device wherein a representation of at least a portion of the one or more time series is provided via an interactive user interface of the user computing device.

20 Claims, 8 Drawing Sheets

(56) References Cited

OTHER PUBLICATIONS

Berthelot, David et al. BEGAN—Boundary Equilibrium Generative Adversarial Networks, May 31, 2017, pp. 1-10. arXiv:1703.10717.
Comprehensive Capital Analysis and Review 2012: Methodology and Results for Stress Scenario Projections, Mar. 2012, Board of Governors of the Federal Reserve System, Mar. 13, 2012, (82 pages). [Retrieved From the Internet Oct. 4, 2019] <https://www.federalreserve.gov/newsevents/pressreleases/files/bcreg20120313a1.pdf>.
Federal Reserve. Comprehensive Capital Analysis and Review: Objectives and Overview, Board of Governors of Federal Reserve System, Mar. 18, 2011,pp. I-21. [Retrieved From the internet Oct. 16, 2019] <http://wwwfederalreserve.gov/newsevents/press/bcreg/bcreg20110318al.pdf>.
Fedus, William Fedus et al. Many Paths to Equilibrium: GANs Do Not Need to Decrease a Divergence at Every Step, Published a Conference Paper at ICLR2018, Feb. 20, 2018, pp. 1-21. arXiv:1710.08446v3.
Fundamental Review of the Trading Book-Revised Market Risk Capital Framework and its Implementations, EY, Jan. 14, 2019 (5 pages).
Goodfellow, Ian J. et al. Generative Adversarial Nets, in Advances in Neural Information Processing Ssytems, (2014), pp. 2672-2680. arXiv:1406.2661v1.
Gulrajani, Ishaan et al. Improved Training of Wasserstein GANs, Advances in Neural Information Processing, (2017), pp. 1-11. arXiv:1704.00028v3.
Hansson, Magns et al., Feedforward Neural Networks With Relu Activation Functions are Linear Splines, Bachelor's Theses in Mathematical Sciences, (2017), (36 pages).
Keras: The Python Deep Learning Library, (5 pages), (Online). [Retrieved From the Internet Oct. 4, 2019] <https://keras.io/>.
Kernel Approximation, Python Scikit Learn Library, (4 pages), (Online). [Retrieved From the Internet Oct. 4, 2019] <From the Internet Oct. 4, 2019] <httP://scikit-learn.org/stable/modules/kernel_approximation.html>.
Kodali, Naveen et al. On Convergence and Stability of GANs, Dec. 10, 2017, pp. 1-18. arXiv:1705.07215.
Lucic, Mario et al. Are GANs Created Equal? A Large-Scale Study. 32nd Conference on Neural Information Processing Systems, (2018), pp. 700-709, Montreal, Canada. arXiv:1711.10337v3.
Luo, Rui Luo et al. A Neural Stochastic Volatility Model, The Thirty-Second AAAI Conference on Artificial Intelligence (AAAI-18), Apr. 6, 2018, pp. 6401-6408. Xiv:1712.00504v1. 2017.
Mao, Xudong et al. Least Squares Generative Adversarial Networks, Proceedings of the IEEE International Conference on Computer Vision, (2017), pp. 2794-2802. arXiv preprint ArXiv:1611.04076.
Mirza, Mehdi et al. Conditional Generative Adversarial Nets, Nov. 6, 2014, (7 pages). arXiv: 1411.1784v1.
Radford, Alec et al. Unsupervised Representation Learning with Deep Convolutional Generative Adversarial Networks, Jan. 7, 2016, pp. 1-16. arXiv: 1511.0643. 2015.
Salimans, Tim et al. Improved Techniques for Training GANs, Advances In Neural Information Processing Systems, (2016), pp. 1-9. arXiv:1606.03498v1.
Tsa Y, Ruey S. Analysis of Financial Time Series, 2nd Edition, John Wiley & Sons, Inc., (2002), (457 pages). ISBN: 0-471-41544-8.
U.S. Census Bureau, (Online), (3 pages). [Retrieved From the Internet Oct. 1, 2019] <https://www.ceusus.gov/>.
Weiss, Richard. Experiment: Simple Conditioning ofWGANs, Jul. 21, 2017, pp. 1-5. [Retrieved From the Internet Oct. 4, 2019] <httP://blog.richardweiss.org/2017/07/21/conditional-wasserstein-gan.html>.
Yahoo Finance—Business Finance, Stock Market, Quotes, News, (4 pages), (Online). [Retrieved From the Internet Oct. 4, 2019] <https://finance.yahoo.com>.
Zhou, Xingyu et al. Stock Market Prediction on High Frequency Data Using Generative Adversarial Nets, Hindawi, Mathematical Problems in Engineering vol. 2018, Article ID 4907423, Apr. 15, 2018, (12 pages). DOI: 10.1155/2018/4907423.
U.S. Appl. No. 16/531,518, filed Aug. 5, 2019, U.S. Pat. No. 11,042,677, Issued.

* cited by examiner

| | |
|---|---|
| 421 | for *number of training iterations* do |
| 422 |     for *ndis* steps do |
| 423 |         sample a batch from the real data $x$ and their corresponding conditions $y$ |
| 424 |         sample a batch of noise $z$ from $pz$ |
| 425 |         pass $x$, $y$, $z$ to the cost function $C$ and update the weights/parameters of the discriminator network using an optimization scheme |
| 426 |         perform weight clipping $(-c, c)$ for weights/parameters of the discriminator network |
| 427 |     end for |
| 428 |     sample a batch of noise $z$ from $pz$ |
| 429 |     update weights/parameters of the generator network using optimization scheme based on cost function $C$ |
| 430 | end for |

FIG. 4B

SYSTEMS AND METHODS FOR TIME SERIES SIMULATION

CROSS-REFERENCE TO RELATED APPLICATIONS

This Application is a continuation of U.S. patent application Ser. No. 16/531,518, filed Aug. 5, 2019, which claims priority to U.S. Patent Application No. 62/834,534, filed Apr. 16, 2019, the contents of which are herein incorporated in their entireties by reference.

TECHNOLOGICAL FIELD

Example embodiments of the present disclosure relate generally to the simulation of time series and, more particularly, to systems and methods for simulating time series using a conditional generative adversarial network (CGAN).

BACKGROUND

A time series is a series of a plurality of instances of information/data that are ordered based on times associated with the instances of information/data. Time series may be used to perform various analyses regarding how various measurements and/or variables evolve with time. However, generating realistic time series data can be difficult. For example, the estimation or generation of non-Gaussian, skewed, heavy-tailed distributions with time-varying dependence features may be particularly difficult.

BRIEF SUMMARY

Systems, apparatuses, methods, and computer program products are disclosed herein for generating realistic time series distributions. Various embodiments provide for the simulation of realistic time series distributions, including non-Gaussian, skewed, heavy-tailed distributions with time-varying dependence features. In particular, various embodiments of the present invention use a CGAN for generating realistic time series distributions.

In one example embodiment, a system is provided for generating realistic time series distributions. The system includes at least one computing entity configured to operate a CGAN.

In another example embodiment, an apparatus is provided for generating or simulating realistic time series distributions using a CGAN.

In another example embodiment, a method is provided for generating or simulating time series distributions using a CGAN.

Various embodiments provide methods, apparatus, systems, computer program products, and/or the like for generating and/or simulating time series using conditional generative adversarial networks (CGANs). CGANs are traditionally used in the field of image processing. A CGAN comprises two neural networks that contest with each other in a game, such as a zero-sum game, for example. A first neural network, referred to as the generator network, attempts to generate an image, for example, that is similar to an input image. A second neural network, referred to as the discriminator network, attempts to determine which images, for example, provided to the discriminator network were generated by the generator network and which were not generated by the generator network. The generator and discriminator networks are collaboratively trained in a semi-supervised or unsupervised fashion.

Additionally, the training images used to train the generator and discriminator networks of the CGAN are each associated with a condition or label. A CGAN traditionally includes subnetworks that are each trained using training data corresponding to one discrete value of the condition. For example, the training data may be partitioned based on the corresponding discrete condition values and each partition of the training data may be used to train a corresponding subnetwork (e.g., including a generator sub-network and a discriminator sub-network). However, when generating or simulating time series, one or more conditions, rather than being discrete as in the traditional image processing CGAN applications, be continuous. For example, the conditions may be current and/or historical values corresponding to one or more input instances of information/data and the time series generated and/or simulated by the CGAN may be an extension of a time series that includes the one or more input instances of information/data. For example, the conditions may be current and/or historical values describing a level or volatility of one or more indexes that may affect the evolution of one or more values of the instances of information/data of the time series. For example, if the time series comprises a plurality of instances of information/data that each include a gross domestic product (GDP) value, the conditions may include current and/or historical economic volatility information/data, current and/or historical GDP values, and/or the like.

Thus, various embodiments provide a continuous condition generative adversarial networks (CCGANs). Various embodiments provide CCGANs configured for generating and/or simulating a time series using one or more continuous conditions. In various embodiments, a CCGAN may be configured for one or more continuous conditions and one or more categorical (e.g., discrete) conditions. In various embodiments, one or more conditions are provided along with training data such that the CCGAN is trained to generate an n-lag conditional predictive distribution from the one or more conditions.

Traditionally, time series are simulated using an autoregressive model (AR), generalized autoregressive conditional heteroscedasticity (GARCH) model, and variants thereof. As an alternative to these traditional time series simulations, stochastic models have also been used, such as the Hull White model and the Ornstein-Uhlenbeck process. However, these models are strongly dependent on model assumptions and estimation of the model parameters and, thus, are less effective in the estimation or generation of time series corresponding to non-Gaussian, skewed, and/or heavy-tailed distributions and/or distributions with time-varying dependence features. As described herein, a CGAN or CCGAN provides a non-parametric technique capable of learning dependence structures of time series and simulating conditional predictive time series, even for time series corresponding to non-Gaussian, skewed, and/or heavy-tailed distributions and/or distributions with time-varying dependence features.

For example, the use of the CCGAN to generate and/or simulate the time series removes the model assumptions and enables the effective generation and/or simulation of time series corresponding to non-Gaussian, skewed, and/or heavy-tailed distributions and/or distributions with time-varying dependence features. Thus, the use of the CCGAN provides a technical improvement in the field of generating and/or simulating time series as the removal of the model assumptions allows for a more accurate determination of values of a time series and the correlations (e.g., first order and/or second order) between various elements of the instances of information/data of the time series and/or determined based on the time series. For example, when a time series determined by traditional means is used, the correlation between two elements or parameters is set by the model assumptions rather than by the actual, real world relationship between the two elements or parameters. By generating and/or simulating the time series using the CCGAN, the correlation between the two elements or parameters represents the correlation between the two elements or parameters learned by the CCGAN based on training data used to train the CCGAN. Thus, using the CCGAN to generate and/or simulate time series provides a technical advantage.

According to a first aspect, a method for generating one or more time series is provided. In an example embodiment, the method comprises receiving by a time series simulator operating on a computing device, information corresponding to a request for one or more time series. The method further comprises formatting at least a portion of the information corresponding to the request for the one or more time series into input data by the time series simulator. The input data comprises at least one continuous condition. The method further comprises generating, via a generator network of the continuous condition generative adversarial network (CCGAN) operating on the computing device, the one or more time series based on the input data. The one or more time series are generated directly based on a value of the at least one continuous condition. The method further comprises compiling the one or more time series by the time series simulator; and providing, via the computing device, the one or more time series. The one or more time series are provided such that the time series is at least one of (a) provided as input to an analysis pipeline or (b) received by a user computing device wherein a representation of at least a portion of the one or more time series is provided via an interactive user interface of the user computing device.

According to another aspect, an apparatus for generating one or more time series is provided. In an example embodiment, the apparatus comprises processing circuitry (e.g., one or more processors and/or simulator circuitry). In an example embodiment, the processing circuitry is configured to receive, by a time series simulator operating on the apparatus, information corresponding to a request for one or more time series; operate the time series simulator to format at least a portion of the information corresponding to the request for the one or more time series into input data, the input data comprising at least one continuous condition; operate a generator network of the continuous condition generative adversarial network (CCGAN) to generate the one or more time series based on the input data, wherein the one or more time series are generated directly based on a value of the at least one continuous condition; operate the time series simulator to compile the one or more time series; and cause the one or more time series to be provided such that the time series is at least one of (a) provided as input to an analysis pipeline or (b) received by a user computing device wherein a representation of at least a portion of the one or more time series is provided via an interactive user interface of the user computing device. For example, the apparatus may comprise communication circuitry (e.g., communication interface) and the processing circuitry may be configured to cause the communication circuitry to provide (e.g., transmit) the one or more time series such that a user computing device receives the one or more time series.

According to yet another aspect, a computer program product for generating one or more time series is provided. In an example embodiment, the computer program product comprises at least one non-transitory computer-readable storage medium storing software instructions. The software instructions, when executed, cause an apparatus to receive, by a time series simulator operating on the apparatus, information corresponding to a request for one or more time series; operate the time series simulator to format at least a portion of the information corresponding to the request for the one or more time series into input data, the input data comprising at least one continuous condition; operate a generator network of the continuous condition generative adversarial network (CCGAN) to generate the one or more time series based on the input data, wherein the one or more time series are generated directly based on a value of the at least one continuous condition; operate the time series simulator to compile the one or more time series; and cause the one or more time series to be provided such that the time series is at least one of (a) provided as input to an analysis pipeline or (b) received by a user computing device wherein a representation of at least a portion of the one or more time series is provided via an interactive user interface of the user computing device.

The foregoing brief summary is provided merely for purposes of summarizing some example embodiments illustrating some aspects of the present disclosure. Accordingly, it will be appreciated that the above-described embodiments are merely examples and should not be construed to narrow the scope of the present disclosure in any way. It will be appreciated that the scope of the present disclosure encompasses many potential embodiments in addition to those summarized herein, some of which will be described in further detail below.

BRIEF DESCRIPTION OF THE FIGURES

Having described certain example embodiments of the present disclosure in general terms above, reference will now be made to the accompanying drawings, which are not necessarily drawn to scale. Some embodiments may include fewer or more components than those shown in the figures.

FIG. 4B illustrates pseudocode for training a CCGAN, in accordance with an example embodiment described herein.

DETAILED DESCRIPTION

Figure 1:
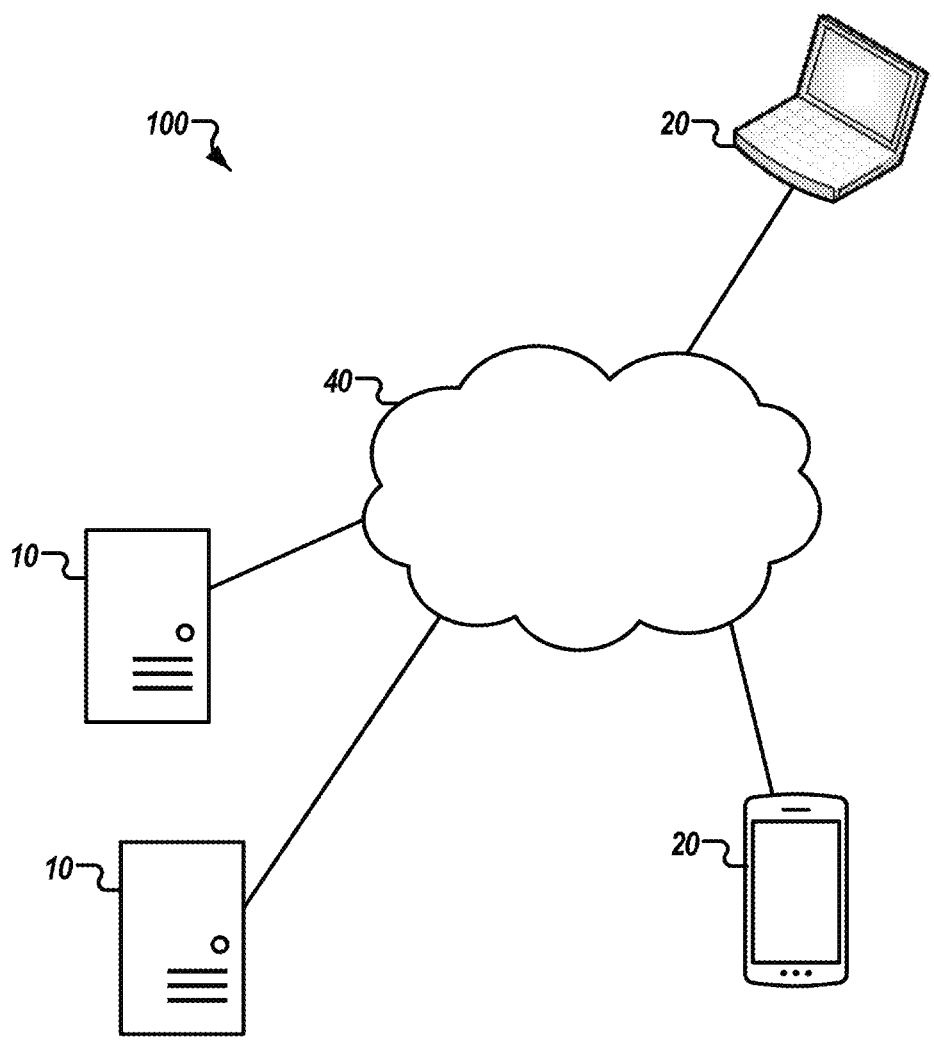
FIG. 1 is a block diagram showing an example architecture of one embodiment described herein.

Some embodiments of the present disclosure will now be described more fully hereinafter with reference to the accompanying figures, in which some, but not all embodiments of the disclosures are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

Where the specification states that a particular component or feature "may," "can," "could," "should," "would," "preferably," "possibly," "typically," "optionally," "for example," "often," "exemplary," or "might" (or other such language) be included or have a characteristic, that particular component or feature is not required to be included or to have the characteristic. Such terminology is intended to convey that the particular component or feature is included in some embodiments while excluded in others, or has the characteristic in some embodiments while lacking the characteristic in others.

The term "computing device" is used herein to refer to any one or all of programmable logic controllers (PLCs), programmable automation controllers (PACs), industrial computers, desktop computers, personal data assistants (PDAs), laptop computers, tablet computers, smart books, palm-top computers, personal computers, smartphones, wearable devices (such as headsets, smartwatches, or the like), and similar electronic devices equipped with at least a processor and any other physical components necessary to perform the various operations described herein. Devices such as smartphones, laptop computers, tablet computers, and wearable devices are generally collectively referred to as mobile devices.

The term "server" or "server device" is used to refer to any computing device capable of functioning as a server, such as a master exchange server, web server, mail server, document server, or any other type of server. A server may be a dedicated computing device or a server module (e.g., an application) an application hosted by a computing device that causes the computing device to operate as a server. A server module (e.g., server application) may be a full function server module, or a light or secondary server module (e.g., light or secondary server application) that is configured to provide synchronization services among the dynamic databases on computing devices. A light server or secondary server may be a slimmed-down version of server type functionality that can be implemented on a computing device, such as a smart phone, thereby enabling it to function as an Internet server (e.g., an enterprise e-mail server) only to the extent necessary to provide the functionality described herein.

Overview

Various embodiments provide methods, systems, apparatuses, and/or computer program products for generating and/or simulating time series. In various embodiments, a time series is a series of a plurality of instances of information/data that are ordered based on times associated with the instances of information/data.

Various embodiments provides methods, systems, apparatuses, and/or computer program products for generating and/or simulating time series using CCGANs. For example, various embodiments provide methods, systems, apparatuses, and/or computer program products for training a CCGAN and/or using a trained CCGAN to generate and/or simulate a time series. In various embodiments, a time series may be generated and/or simulated responsive to receiving a request for a generated and/or simulated time series. For example, the request may be generated and/or provided responsive to a human user interacting with an interactive user interface (IUI) and/or by a machine user. Various embodiments provide an IUI and/or analysis pipeline for providing and/or determining a time series prediction and/or future measure value(s) based on the generated and/or simulated time series. Various embodiments may be used to validate one or more models (e.g., economic models and/or the like).

In various embodiments, the CCGAN is trained such that the one or more conditions (e.g., the continuous conditions and optionally any categorical/discrete conditions) are passed directly to the generator network such that the generator network generates and/or simulates the time series based on the conditions passed to the generator network. This is in contrast to a traditional CGAN were the conditions are used to determine which sub-network to use to generate an image rather than directly using the conditions themselves in generating the image. For example, categorical and/or discrete conditions may be used as dummy variables to indicate a cluster or group corresponding to an instance of information/data of the time series and/or the time series as a whole. For example, a categorical and/or discrete condition may be used to indicate whether an instance of information/data of the time series corresponds to a time of economic stress or to a time of a non-stressed economy.

In contrast, the continuous conditions may be used directly by the CCGAN in determining one or more elements of an instance of information/data of a time series. For example, rather than being a dummy variable, the value of a continuous condition is directly used in the determination of at least one element of the time series. For example, a continuous condition may be used to provide an n-time step lag of a previously determined element. For example, each instance of a time series includes a value for a first element. The value of the first element determined at time step $t_i$ may then be provided as a continuous condition for determining the value of the first element at time step $t_{i+n}$. In an example embodiment, n=1, such that the value of the first element at time step $t_i$ is provided as a continuous condition for determining the value of the first element at time step $t_{i+1}$. As such, the continuous condition is not merely used as a dummy variable, but rather is used directly by the CCGAN for determining values for elements of the instance of information/data of the time series. For example, for a time series with a strong one time step lag autocorrelation, the time series value at time step $t_i$ may be used as the continuous condition for the prediction of the value at time step $t_{i+1}$. For a time series with an underlying volatility dynamic, the volatility value at time step $t_i$ may be used as the continuous condition for the prediction of the value at time step $t_{i+1}$, possibly in addition to the time series value at time step $t_i$.

In various embodiments, the generated time series are used in calculation of Value-at-Risk (VaR), expected shortfall (ES), predict the movement of market risk factors, predict economic values (e.g., GDP, unemployment, and/or the like), comprehensive capital analysis and review (CCAR), primary market risk, benchmarking for an economic model, predicting financial derivatives, simulating data for trading, simulating data that is missing from a data set (e.g., determine a portion of a time series or one or more instances of information/data of a time series that is missing the one or more instances of information/data), determine first order and/or second order correlations between various models, elements, and/or time varying values, and/or the like.

Accordingly, the present disclosure sets forth systems, methods, apparatuses, and computer program products that generate and/or simulate time series using a CCGAN. There are many advantages of these and other embodiments described herein. For instance, the CCGAN provides improved generated and/or simulated time series corresponding to non-Gaussian, skewed, and/or heavy-tailed distributions and/or distributions with time-varying dependence features. Additionally, time series generated and/or simulated via a CCGAN are not affected by the model assumptions of traditional time series generation and/or simulation means, such that correlations (e.g., first and/or second order correlations) between elements or parameters may be determined independent of model parameters.

Although a high level explanation of the operations of example embodiments has been provided above, specific details regarding the configuration of such example embodiments are provided below.

System Architecture

Example embodiments described herein may be implemented using any of a variety of computing devices or servers. To this end, FIG. 1 illustrates an example environment 100 within which embodiments of the present disclosure may operate to generate and/or simulate time series using a CCGAN. As illustrated, the example embodiment 100 may include one or more system computing devices 10 and one or more user computing devices 20. The one or more system computing devices and/or one or more user computing devices 20 may be in electronic communication with, for example, one another over the same or different wireless or wired networks 40. For example, a user computing device 20 may provide (e.g., transmit, submit, and/or the like) a request for time series generation and/or simulation to a system computing device 10 via one or more wireless or wired networks 40. For example, a system computing device may provide (e.g., transmit) a generated and/or simulated time series to a user computing entity 20 via one or more wireless or wired networks 40.

The one or more system computing devices 10 may be embodied as one or more servers, such as that described below in connection with FIG. 2. The one or more system computing devices 10 may further be implemented as local servers, remote servers, cloud-based servers (e.g., cloud utilities), or any combination thereof. The one or more system computing devices 10 may receive, process, generate, and transmit data, signals, and electronic information to facilitate the operations of generating and/or simulating and providing one or more time series. In various embodiments, a system computing device 10 may store and/or be in communication with one or more databases. In an example embodiment, the one or more databases may be embodied as one or more data storage devices, such as a Network Attached Storage (NAS) device or devices, or as one or more separate databases or servers. The one or more databases may store information accessed by the system computing device 10 to facilitate the operations of generating and/or simulating and providing one or more time series. For example, the one or more databases may store control signals, device characteristics, and access credentials for one or more of the user computing devices 20.

Figure 3:
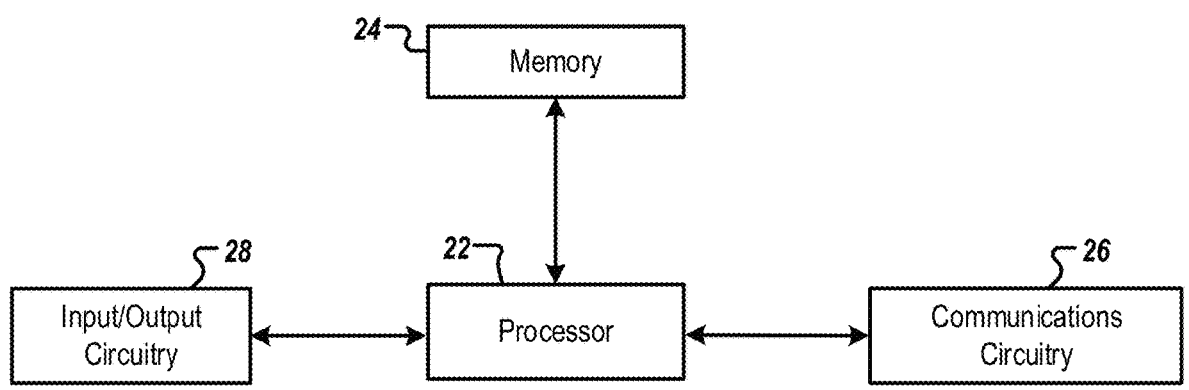
FIG. 3 is a block diagram of a user computing entity that may be specifically configured in accordance with an example embodiment described herein.

The one or more user computing devices 20 may be embodied by any computing devices known in the art, such as those described below in connection with FIG. 3. The system computing device 10 may receive information from, and transmit information to, the one or more user computing devices 20. For example, the system computing device 10 may receive a request for one or more time series generated and provided by a user computing device 20. For example, the system computing device 10 may provide one or more time series and/or portion thereof such that a user computing device 20 receives the one or more time series and/or portion thereof. It will be understood that in some embodiments, the one or more user computing devices 20 need not themselves be independent devices, but may be peripheral devices communicatively coupled to other computing devices.

Exemplary Computing Devices

The system computing device 10 described with reference to FIG. 1 may be embodied by one or more computing devices or servers, such as the example system computing device 10 shown in FIG. 2. As illustrated in FIG. 2, the system computing device 10 may include processing circuitry 12, memory 14, communications circuitry 16, input-output circuitry 18, and/or simulator circuitry 19, each of which will be described in greater detail below. In some embodiments, the system computing device 10 may further comprise a bus (not expressly shown in FIG. 2) for passing information between various components of the system computing device. The system computing device 10 may be configured to execute various operations described above in connection with FIG. 1 and below in connection with FIGS. 4 and 5.

In some embodiments, the processor 12 (and/or co-processor or any other processing circuitry assisting or otherwise associated with the processor) may be in communication with the memory 14 via a bus for passing information among components of the apparatus. The processor 12 may be embodied in a number of different ways and may, for example, include one or more processing devices configured to perform independently. Additionally or alternatively, the processor may include one or more processors configured in tandem via a bus to enable independent execution of software instructions, pipelining, and/or multithreading. The use of the terms "processor" or "processing circuitry" may be understood to include a single core processor, a multi-core processor, multiple processors of the system computing device 10, remote or "cloud" processors, or any combination thereof.

In an example embodiment, the processor 12 may be configured to execute software instructions stored in the memory 14 or otherwise accessible to the processor. Alternatively or additionally, the processor 12 may be configured to execute hard-coded functionality. As such, whether configured by hardware or software methods, or by a combination of hardware with software, the processor 12 may represent an entity (e.g., physically embodied in circuitry) capable of performing operations according to an embodiment of the present invention while configured accordingly. Alternatively, as another example, when the processor 12 is embodied as an executor of software instructions, the software instructions may specifically configure the processor 12 to perform the algorithms and/or operations described herein when the software instructions are executed.

Memory 14 is non-transitory and may include, for example, one or more volatile and/or non-volatile memories. In other words, for example, the memory 14 may be an electronic storage device (e.g., a computer readable storage medium). The memory 14 may be configured to store information, data, content, applications, software instructions, or the like, for enabling the apparatus to carry out various functions in accordance with example embodiments contemplated herein.

The communications circuitry 16 may be any means such as a device or circuitry embodied in either hardware or a combination of hardware and software that is configured to receive and/or transmit data from/to a network and/or any other device, circuitry, or module in communication with the system computing device 10. In this regard, the communications circuitry 16 may include, for example, a network interface for enabling communications with a wired or wireless communication network. For example, the communications circuitry 16 may include one or more network interface cards, antennas, buses, switches, routers, modems, and supporting hardware and/or software, or any other device suitable for enabling communications via a network 40. Additionally or alternatively, the communication interface 16 may include the circuitry for causing transmission of such signals to a network or to handle receipt of signals received from a network.

In some embodiments, the apparatus 200 may include input/output circuitry 18 in communication configured to provide output to a user and, in some embodiments, to receive an indication of user input. The input/output circuitry 18 may comprise a user interface, such as a display, and may further comprise the components that govern use of the user interface, such as a web browser, mobile application, dedicated client device, or the like. In some embodiments, the input/output circuitry 18 may additionally or alternatively include a keyboard, a mouse, a touch screen, touch areas, soft keys, a microphone, a speaker, and/or other input/output mechanisms. The input/output circuitry 18 may utilize the processor 12 to control one or more functions of one or more of these user interface elements through software instructions (e.g., application software and/or system software, such as firmware) stored on a memory (e.g., memory 14) accessible to the processor 12.

In addition, the system computing device 10 further comprises simulator circuitry 19, which includes hardware components designed for acting as a CCGAN-based time series simulator. The simulator circuitry 19 may utilize processor 12, memory 14, or any other hardware component included in the system computing device 10 to perform these operations, as described in connection with FIGS. 4 and 5 below. The simulator circuitry 19 may further utilize communications circuitry 16 to receive time series requests and/or provide one or more time series and/or portions thereof (e.g., in response to a request therefor), or may otherwise utilize processor 12 and/or memory 14 to access information/data and/or executable instructions (e.g., software) used to generate and/or simulate one or more time series and/or to store generated and/or simulated time series, and/or the like. In an example embodiment, the functionality described herein as being performed by the simulator circuitry 19 is performed through the execution executable instructions by the processor 12. In an example embodiment, the simulator circuitry 19 comprises one or more graphical processing units (GPUs).

Although these components 12-19 may in part be described using functional language, it will be understood that the particular implementations necessarily include the use of particular hardware. It should also be understood that certain of these components 12-19 may include similar or common hardware. For example, the simulator circuitry 19 may, at times, leverage use of the processor 12 or memory 14, but duplicate hardware is not required to facilitate operation of these distinct components of the system computing device 10 (although duplicated hardware components may be used in some embodiments, such as those in which enhanced parallelism may be desired). The use of the term "circuitry" as used herein with respect to components of the model computing device 10 therefore shall be interpreted as including the particular hardware configured to perform the functions associated with the particular circuitry described herein. Of course, while the term "circuitry" should be understood broadly to include hardware, in some embodiments, the term "circuitry" may refer also to software instructions that configure the hardware components of the model computing entity 10 to perform their various functions.

To this end, each of the communications circuitry 16, input/output circuitry 18, simulator circuitry 19 may include one or more dedicated processors, specially configured field programmable gate arrays (FPGA), and/or application specific interface circuit (ASIC) to perform its corresponding functions, these components may additionally or alternatively be implemented using a processor (e.g., processor 12) executing software stored in a memory (e.g., memory 14). In this fashion, the communications circuitry 16, input/output circuitry 18, and/or simulator circuitry 19 are therefore implemented using special-purpose components implemented purely via hardware design or may utilize hardware components of the system computing device 10 that execute computer software designed to facilitate performance of the functions of the communications circuitry 16, input/output circuitry 18, and/or simulator circuitry 19.

The user computing device 20 described with reference to FIG. 1 may be embodied by one or more computing devices, personal computers, desktop computers, client devices (e.g., of the system computing device 10), and/or mobile devices, such as the example user computing device 20 shown in FIG. 3. The illustrated example user computing device 20 includes processing circuitry and/or processor 22, memory 24, communications circuitry 26, and input-output circuitry 28, each of which is configured to be similar to the similarly named components described above in connection with FIG. 2. In various embodiments, the processor 22, memory 24, and input-output circuitry 28 are configured to provide an IUI configured for user interaction (e.g., via the input-output circuitry 28). For example, the IUI may be configured to receive user input initiating a time series request and/or to provide a time series and/or portion thereof.

In some embodiments, various components of the system computing device 10 and/or user computing device 20 may be hosted remotely (e.g., by one or more cloud servers) and thus need not physically reside on the corresponding computing device 10, 20. Thus, some or all of the functionality described herein may be provided by third party circuitry. For example, a given computing device 10, 20 may access one or more third party circuitries via any sort of networked connection that facilitates transmission of data and electronic information between the computing device 10, 20 and the third party circuitries. In turn, that computing device 10, 20 may be in remote communication with one or more of the other components describe above as comprising the computing device 10, 20.

As will be appreciated based on this disclosure, example embodiments contemplated herein may be implemented by a system computing device 10 and/or user computing device 20. Furthermore, embodiments may take the form of a computer program product on at least one non-transitory computer-readable storage medium (e.g., memory 14, 24) storing software instructions. Any suitable non-transitory computer-readable storage medium may be utilized, some examples of which are non-transitory hard disks, CD-ROMs, flash memory, optical storage devices, and magnetic storage devices. It should be appreciated, with respect to certain system computing devices 10 as described in FIG. 2 or user computing devices 20 as described in FIG. 3, that loading the software instructions onto a computer or apparatus produces a special-purpose machine comprising the means for implementing various functions described herein.

Having described specific components of example system computing devices 10 and user computing devices 20, example embodiments are described below in connection with a series of flowcharts.

Example Time Series Simulator

In various embodiments, a time series simulator is provided. The time series simulator comprises CCGAN. In various embodiments, the time series simulator may further comprise a pre-processing module configured to pre-process information/data to be provided as input to the CCGAN, a post-processing module configured to post-process time series generated and/or simulated by the CCGAN, one or more analysis pipelines configured to analyze one or more time series generated and/or simulated by the CCGAN, and/or the like. In various embodiments, a CCGAN is used to generate and/or simulate one or more time series. A time series is a series of a plurality of instances of information/data that are ordered based on times associated with the instances of information/data. Each instance of information/data may comprise a value for one or more elements. Some example elements may be an index value, a market rate or value, a volatility measure, a GDP value, an unemployment value, stock returns, and/or any element of interest that may change over time (e.g., that may change over the time period corresponding to the time series).

Figure 4A:
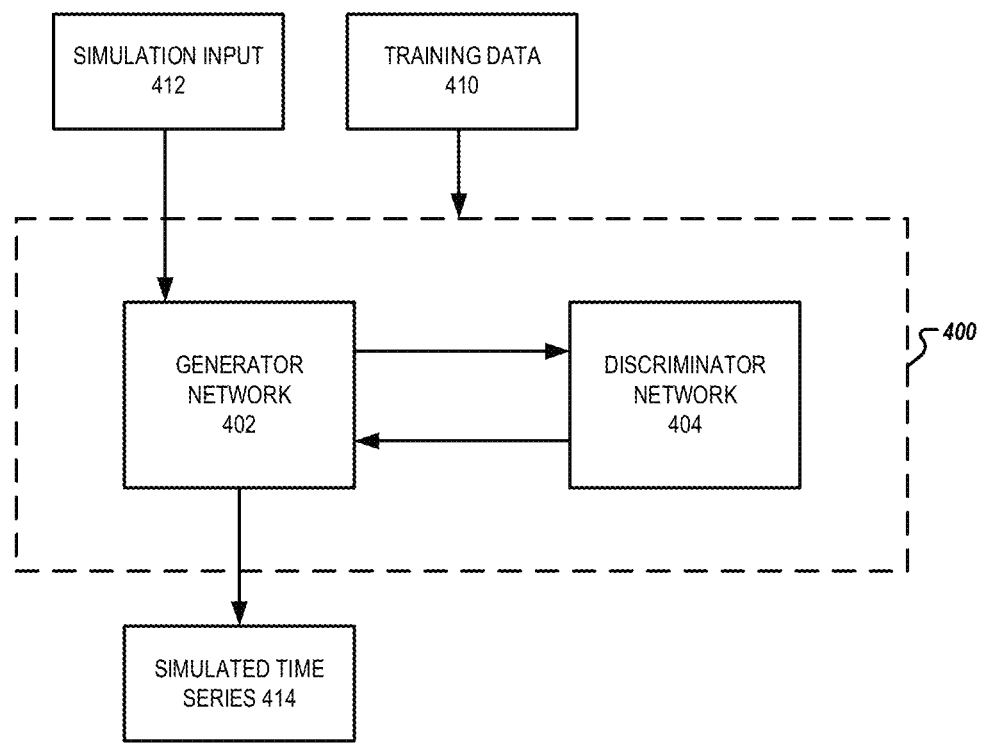
FIG. 4A is a block diagram showing an example architecture of a CCGAN for generating and/or simulating time series, in accordance with an example embodiment described herein.

FIG. 4A provides a block diagram showing an example schematic of a CCGAN 400. The CCGAN comprises a generator network 402 and a discriminator network 404. In an example embodiment, the CCGAN is a continuous conditional Wasserstein generative adversarial network (CCW-GAN). The generator network 402 (and possibly the discriminator network 404) is configured to receive one or more conditions (e.g., as part of the simulation input 412 or as part of the training data 410 during training). At least one of the one or more conditions is a continuous condition. For example, a continuous condition may take any value within a range of values and is not confined to a predefined set of values. In an example embodiment, one or more of the conditions is a categorical or discrete condition which has a value that is selected from a predefined set of values. For example, a categorical or discrete condition may take a value selected from the predefined closed set 0, 1, 2, 3, 4, 5, 6, 7, 8, and 9. For example, a continuous condition may take a value within the defined range 0-9 (e.g., 1.41, 2.72, 3.14, and/or the like). In some embodiments, a continuous condition may not be defined by a range, but may be able to take any value.

In various embodiments, the continuous conditions are provided to the generator network 402 (along with any other input) via an input layer of the generator network 402. The CCGAN may be configured to pass the continuous conditions from the input layer through one or more hidden layers, such that the continuous conditions are used to determine the resulting simulated time series 414 provided via the output layer of the CCGAN. In an example embodiment, the architecture of both the generator network 402 and the discriminator network 404 include a 3-layer forward connected (e.g., feedforward) neural network with at least 100 neurons/nodes for each layer, followed by application of a Leaky Rectified Linear Unit (LeakyRelu) activation function for both the generator network 402 and the discriminator network 404. As should be understood, the number of layers of the generator network 402 and discriminator network 404 may be adjusted in various embodiments as appropriate for the application.

Training a CCGAN comprises a min max game on the cost function between the generator network 402 (G) and the discriminator network 404 (D), where both the generator network 402 and the discriminator network 404 are neural network models. The input of the generator network 402 includes input vector z and conditions vector y, where z and/or values thereof is/are sampled from a distribution and y comprises one or more conditions. For example, z and/or values thereof may be sampled from a noise distribution. In various embodiments, the noise distribution may be a uniform or Gaussian distribution. In general the conditions vector y provides auxiliary and/or contextual information/data. Both z and y are applied to both the generator network 402 and the discriminator network 404 via the corresponding input layers. The values of the input vector z are combined with the values of the condition vector y in joint hidden representation, in an example embodiment. In various embodiments, the cost function C used to train the CCGAN is of the form $C=\min_G \min_D E_{x \sim p_d}[\log(D(x, y))] + E_{z \sim p_z}[\log(1-D(G(z, y)))]$, where $p_z$ is the distribution of the random noise from which the values of z are selected. In an example embodiment, the distribution $p_z$ is a uniform distribution. In an example embodiment, the distribution $p_z$ is a Gaussian distribution. In various embodiments, a weight clipping adjustment is applied to remove the sharp gradients of the discriminator network 404. For example, a gradient penalty may be applied to the discriminator network 404. In an example embodiment, (e.g., an example embodiment in which weight clipping adjustment is applied to remove the sharp gradients of the discriminator network 404) batch normalization is not performed. In various embodiments, an optimization scheme is used to update the weights and/or parameters of the generator network 402 and/or the discriminator network 404. In an example embodiment, Adam (e.g., adaptive moment estimation) is used as the optimization scheme to adjust one or more weights of the CCGAN 400 as a result of a training iteration. For example, the optimization used in an example embodiment includes updating the weights and/or parameters of the discriminator network 404 by ascending its stochastic gradient using Adam.

In an example embodiment, the neural networks of both the generator network 402 and the discriminator network 404 are constructed by fully connected layers followed by application of LeakyRelu activation functions with a. In general, the LeakyRelu activation function with $\alpha$, $f(x, \alpha)$, is $$f(x, \alpha) = \begin{cases} x & x > 0 \\ \alpha x & \text{else} \end{cases},$$

where $\alpha$ is a small constant (e.g., $\alpha=0.01$, in an example embodiment). Application of the LeakyRelu activation function attempts to mitigate the "dying ReLU" problem, where a large gradient flowing through a ReLU neuron/node could cause the weights to update in such a way that the neuron/node will not activate on future data points.

In various embodiments, training the CCGAN comprises performing a plurality of training iterations. FIG. 4B illustrates example pseudocode for training a CCGAN of an example embodiment. For each generator iteration, $n_{dis}$ discriminator iterations are performed. For example, as shown by lines 422-427 of the pseudocode of FIG. 4B, for $n_{dis}$ iterations, a batch is sampled from the training data x and their corresponding conditions y, a batch of noise z is samples from $p_z$; x, y, and z are passed to the cost function and the weights and/or parameters of the discriminator network 404 are updated using an optimization scheme (e.g., by ascending its stochastic gradient using, for example, Adam, or via another optimization scheme); weight clipping is performed for the discriminator weights and/or parameters based on a hyper-parameter for weight clipping c (e.g., the discriminator weights and/or parameters are clipped to be within (−c, c). After performing the $n_{dis}$ iterations, as shown by lines 428-429 of the pseudocode provided by FIG. 4B, a batch of noise z is sampled from $p_z$ and the weights and/or parameters of the generator network 402 are updated using an optimization scheme (e.g., by ascending its stochastic gradient using, for example, Adam, or another optimization scheme) based on the cost function. This process is repeated for a plurality of iterations until a training requirement of the CCGAN 400 is met. In various embodiments, the training requirement of the CCGAN is a number of iterations (e.g., number of training iterations, shown in line 420 of the pseudocode provided by FIG. 4B). In various embodiments, the training requirement of the CCGAN is a convergence of the weights and/or parameters of the generator network 402 and/or the discriminator network 404 to a defined level of convergence.

In various embodiments, a CCGAN may be configured to receive input comprising continuous conditions and categorical and/or discrete conditions. In various embodiments, categorical and/or discrete conditions may be used as dummy variables to indicate a cluster, group, period, or region of time corresponding to an instance of information/data of the time series and/or the time series as a whole. For example, a categorical and/or discrete condition may be used to indicate whether an instance of information/data of the time series corresponds to a time of economic stress or to a time of a non-stressed economy.

In contrast to the categorical and/or discrete conditions, the continuous conditions may be used directly by the CCGAN in determining one or more elements of an instance of information/data of a time series. For example, a continuous condition may be used to provide an n-time step lag of a previously determined element. For example, each instance of a time series includes a value for a first element. The value of the first element determined at time step $t_i$ may then be provided as a continuous condition for determining the value of the first element at time step $t_{i+n}$. In an example embodiment, n=1, such that the value of the first element at time step $t_i$ is provided as a continuous condition for determining the value of the first element at time step $t_{i+1}$. As such, the continuous condition is not merely used as a dummy variable, but rather is used directly by the CCGAN for determining values for elements of the instance of information/data of the time series. In various embodiments, the continuous condition may be a value determined during time step $t_i$ that is applied to time step $t_{i+n}$, but that is not a value of an element within an instance of information/data of the time series. For example, an instance of information/data of the time series may include a value that is a mean or average value of a first element and the value passed to the CCGAN as a continuous condition for time step $t_{i+n}$ may be a value that is a variance or standard deviation corresponding to the first element (or vice versa). In another example embodiment, the continuous condition may provide a measure of volatility for the corresponding time step. In various embodiments, the continuous condition may be raw time series information/data, or rolling period historical time series information/data. In an example embodiment, a multi-horizon time series may be predicted. For example, in a multi-horizon prediction, multiple time steps of the time series may be modeled at the same time (e.g., in parallel, simultaneously, and/or the like).

As noted above, the generator network 402 is configured to sample noise z from distribution $p_z$. As such, the CCGAN 400 may be provided with the same conditions y as input and provide two different simulated time series. In various embodiments, this feature of the CCGAN is used to generate a plurality of simulated time series using the same input information/data 412. The plurality of simulated time series may then be provided to an analysis pipeline. For example, the analysis pipeline may be configured to generate a forecast time series corresponding to an element of the time series by averaging a value for the element from each of the plurality of time series at each time step. For example, the analysis pipeline may be configured to conduct a hypothetical shock analysis. In another example, the analysis pipeline may be configured to determine the likelihood of various scenarios based on a distribution of the plurality of time series.

Example Operation of a System Computing Device

In various embodiments, a system computing device 10 may operate and/or be in communication with a time series simulator comprising a CCGAN. In various embodiments, the CCGAN is trained using training information/data 410, for example as shown in FIG. 4B, and then may be used to generate and/or simulate time series. For example, the system computing device 10 may generate and/or simulate time series based on a received time series request. In various embodiments, a time series request is generated and provided in response to human user interaction with an interactive user interface (IUI) provided via the input-output circuitry 28 of a user computing device 20. In various embodiments, a time series request is generated and provided in response to and/or through the operation of a machine user operating, for example, on a user computing device 20. The system computing device 10 may be configured to receive a time series request, generate and/or simulate one or more time series based on the received time series request, and to provide at least a portion of the one or more time series such that a user computing device 20 receives the at least a portion of the one or more time series. In various embodiments, the at least a portion of the one or more time series may be used provided as input to an analysis pipeline. In an example embodiment, a representation (e.g., graphical representation, tabular representation, and/or the like) of the at least a portion of the one or more time series and/or an output of the analysis pipeline may be provided via an IUI provided via input-output circuitry 28.

Figure 2:
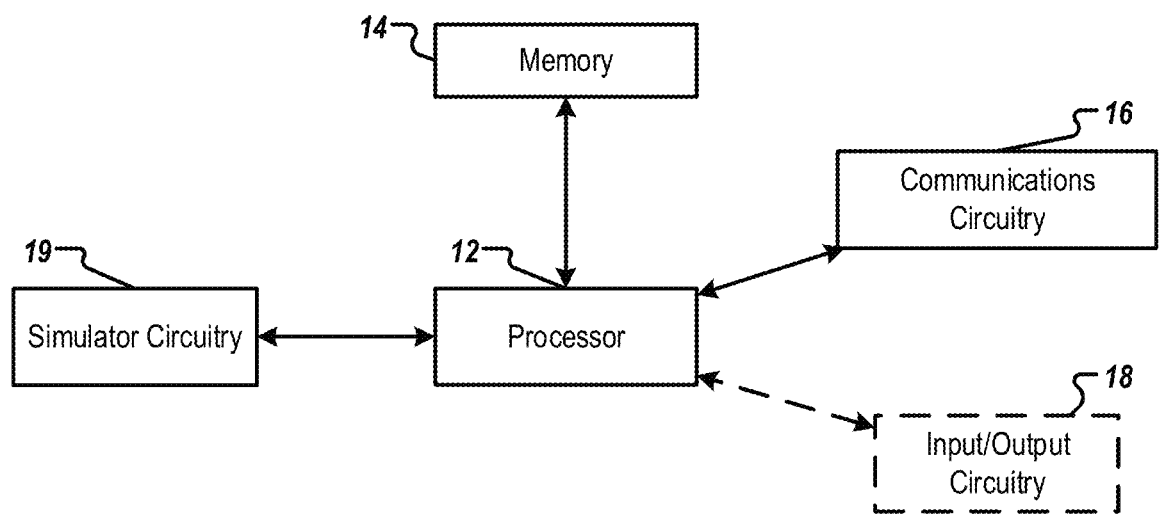
FIG. 2 is a block diagram of a model computing entity that may be specifically configured in accordance with an example embodiment described herein.
Figure 5:
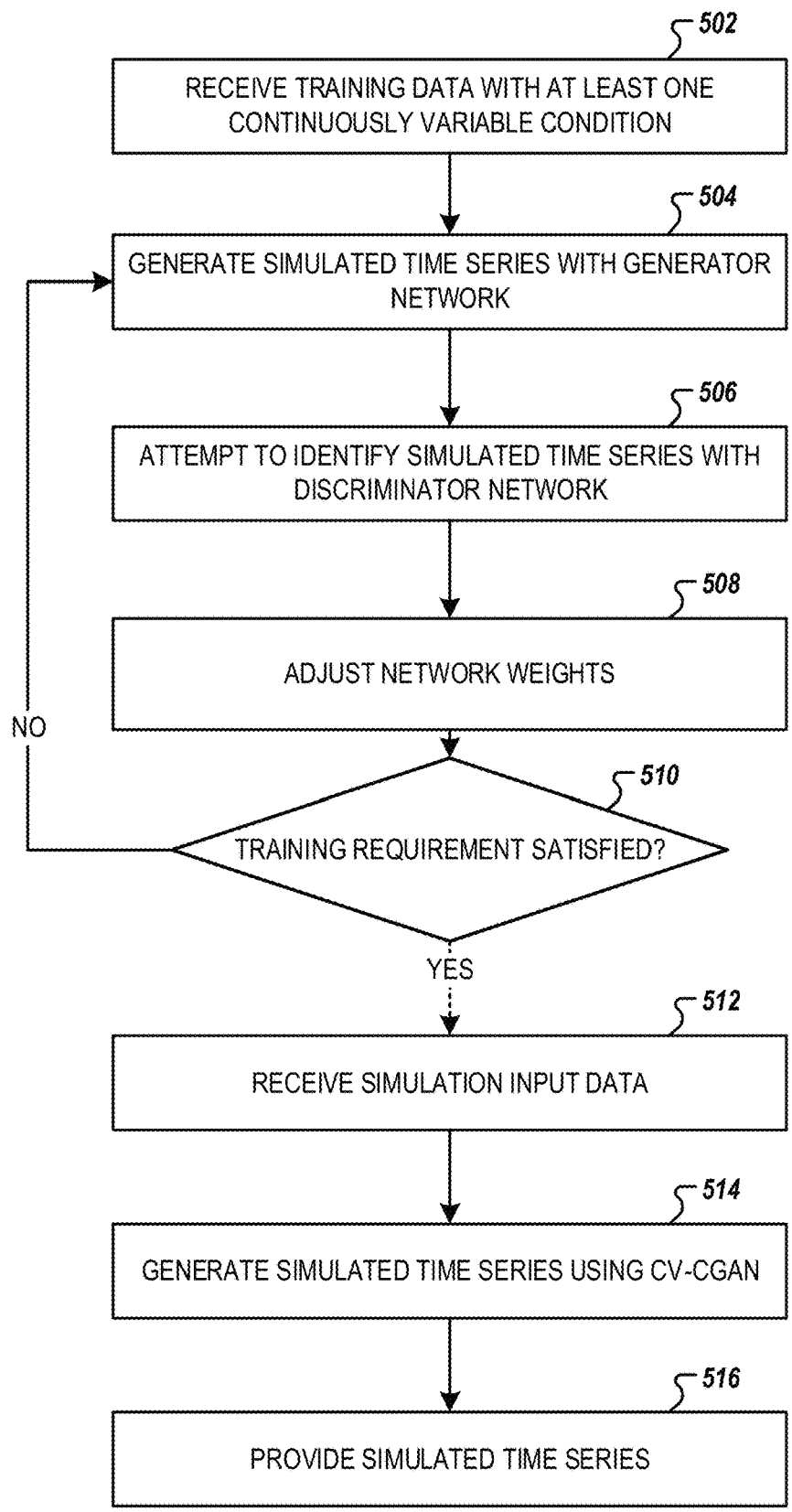
FIG. 5 is a flowchart illustrating operations performed, such as by the model computing entity of FIG. 2 to provide callable options values, in accordance with an example embodiment described herein.

FIG. 5 provides flowchart illustrating operations performed, such as by the system computing device 10 of FIG. 2 to generate and/or simulate time series and provide the time series, in accordance with an example embodiment described herein. Starting at block 502, training information/data 410 is received. For example, the system computing device 10 may receive and/or process training information/data. For example, the system computing device 10 may comprise means, such as processor 12, memory 14, communications interface 16, simulator circuitry 19, and/or the like for receiving and/or processing training information/data. In various embodiments, the training information/data comprises one or more time series. In various embodiments, the training information/data comprises one or more time series comprising instances of information/data that were generated through real world processes. For example, the training information/data may comprise one or more time series comprising historical information/data. In various embodiments, the training information/data may be pre-processed and/or processed by the processor 12 and/or simulator circuitry 19 to place the training information/data in the appropriate format for training the CCGAN 400. For example, the training information/data may be formatted to include time ordered values x associated with corresponding conditions y. For example, the training information/data may be processed and/or formatted by the pre-processing module of the time series simulator, in an example embodiment.

In various embodiments, the conditions y include at least one condition that is a continuous condition. In various embodiments, the at least one condition that is a continuous condition corresponding to a value at time step $t_i$ that is applied by the CCGAN with an n-time step lag such that the value of the continuous condition at time step $t_i$ is used to determine the value of an element of an instance of information/data of the time series corresponding to time step $t_{i+n}$. In various embodiments, n=1 or 2, such that the value of the continuous condition at time step $t_i$ is used to determine the value of an element of an instance of information/data of the time series corresponding to time step $t_{i+1}$ or $t_{i+2}$.

At block 504, one or more simulated time series may be generated using the generator network 402 based on the training information/data. For example, the system computing device 10 may cause the generator network 402 to simulate one or more time series based on the training information/data. For example, the system computing device 10 may comprise means, such as the processor 12, memory 14, simulator circuitry 19, and/or the like, for generating one or more time series using the generator network 402 based on the training information/data.

At block 506, at least one of the one or more simulated time series and/or a time series from the training information/data are analyzed by the discriminator network 404 in an attempt to identify the simulated time series. For example, the system computing device 10 may use the discriminator network 404 to analyze at least one of the one or more simulated time series and/or a time series from the training information/data in an attempt to identify the simulated time series and/or to differentiate the simulated time series from the time series of the training information/data 410. For example, the system computing device 10 may comprise means, such as the processor 12, memory 14, simulator circuitry 19, and/or the like, for analyzing at least one of the one or more simulated time series and/or a time series from the training information/data with the discriminator network 404 in an attempt to identify the simulated time series and/or to differentiate the simulated time series from the time series of the training information/data 410.

At block 508, one or more network weights are modified and/or adjusted. For example, the system computing device 10 may modify and/or adjust one or more weights and/or parameters of the generator network 402 and/or discriminator network 404 based on the discriminator network's ability to identify the simulated time series and/or to differentiate the simulated time series from the time series of the training information/data 410. For example a cost function, (e.g., the cost function C described above) may be used to how well the generator network 402 and the discriminator network 404 have performed at that iteration of the game (e.g., the generator network's performance at generating realistic time series and the discriminator network's performance at differentiating the simulated time series from the time series of the training information/data). An optimization scheme (e.g., Adam stochastic gradient descent, and/or the like) may then be used, based on the cost function, to adjust and/or modify one or more weights and/or parameters of the generator network 402 and/or discriminator network 404. For example, the system computing device 10 may comprise means, such as the processor 12, memory 14, simulator circuitry 19, and/or the like, for modify and/or adjust one or more weights and/or parameters of the generator network 402 and/or discriminator network 404 based on the discriminator network's ability to differentiate the simulated time series generated by the generator network from the time series of the training information/data 410.

At block 510, it is determined if a training requirement has been satisfied. For example, the system computing device 10 may determine if the training requirement is satisfied. For example, the system computing device 10 may comprise means, such as processor 12, memory 14, simulator circuitry 19, and/or the like, for determining if the training requirement is satisfied. In an example embodiment, the training requirement is a defined a number of iterations (e.g., number of training iterations, shown in line 420 of the pseudocode provided by FIG. 4B). In an example embodiment, the training requirement is a convergence requirement corresponding to a convergence of the weights and/or parameters of the generator network 402 and/or the discriminator network 404. For example, if the largest adjustment and/or modification to one or more weights and/or parameters of the generator network 402 and/or the discriminator network 404 is less than a threshold adjustment, it may be determined (e.g., by the system computing device 10) that the weights and/or parameters of the generator network 402 and/or the discriminator network 404 have converged and the training requirement is satisfied. In various embodiments, the training requirement is a combination of a defined number of iterations (e.g., a maximum number of iterations) and a convergence requirement. For example, the system computing device 10 may comprise means, such as processor 12, memory 14, simulator circuitry 19, and/or the like, determining whether a training requirement of the CCGAN is satisfied.

When, at block 510, it is determined that the training requirement is not satisfied, the process returns to block 504 and another iteration of training is performed. When, at block 510, it is determined that the training requirement is satisfied, the CCGAN 400 is ready for use in generating and/or simulating one or more time series.

At block 512, a request for one or more time series is received. For example, the system computing device 10 may receive a request for one or more time series. For example, the time series simulator operating on the system computing device 10 may receive a time series request for one or more time series. For example, the system computing device 10 may comprise means, such as processor 12, memory 14, communications interface 16, user input-output circuitry 18, and/or the like, for receiving a request for one or more time series. In various embodiments, the request for one or more time series comprises and/or indicates input information/data to be used for generating the one or more time series. For example, the request for one or more times series may include the conditions y for one or more time steps $t_{-m}, \ldots$ ., $t_0$ (where m is positive, and $t_{i-1} < t_i < t_{i+1}$). In various embodiments, the conditions y for the one or more time steps $t_{-m}, \ldots, t_0$ include at least one value for a continuous condition for each of the one or more time steps $t_{-m}, \ldots, t_0$. In various embodiments, the conditions y for the one or more time steps $t_{-m}, \ldots, t_0$ may include values for one or more categorical and/or discrete conditions in addition to the at least one value for a continuous condition for each of the one or more time steps $t_{-m}, \ldots, t_0$. In various embodiments, the request for the one or more time series may indicate a set of time steps for which instances of information/data of the time series should be generated (e.g., $t_1, t_2, \ldots, t_N$, where $t_{i-1} < t_i < t_{i+1}$) or final time step (e.g., $t_N$) and a time step size $\Delta t$ (e.g., $\Delta t = t_i - t_{i-1}$). In an example embodiment, the request for the one or more time series may indicate one or more elements for which the instances of information/data of the time series should contain a value. For example, the elements may include an index (e.g., Libor rate, stock market returns, average weekly hours of manufacturing, average weekly jobless claims for unemployment insurance, manufacturer's new orders for consumer goods/materials, slower deliveries diffusion index, manufacturer's new orders for non-defense capital goods, building permits, stock prices of a set number of common stocks, Money Supply, interest rate spread, index of consumer expectations, and/or the like), a volatility measure (e.g., a change between two consecutive values of the same index, and/or the like), VaR, ES an unemployment rate, GDP, and/or any other element of interest that may change over the course of the time series (e.g., between $t_0$ and $t_N$). In various embodiments, the CCGAN 400 is trained to generate time series having a particular set of elements (e.g., to generate a time ordered plurality of instances of information/data each containing a value for each of a set of elements). In such an embodiment, the request for the one or more time series may indicate which elements of the set of elements are to be returned in response to the request. In an example embodiment, the time series request indicates a number of time series to be generated and/or simulated.

Figure 6:
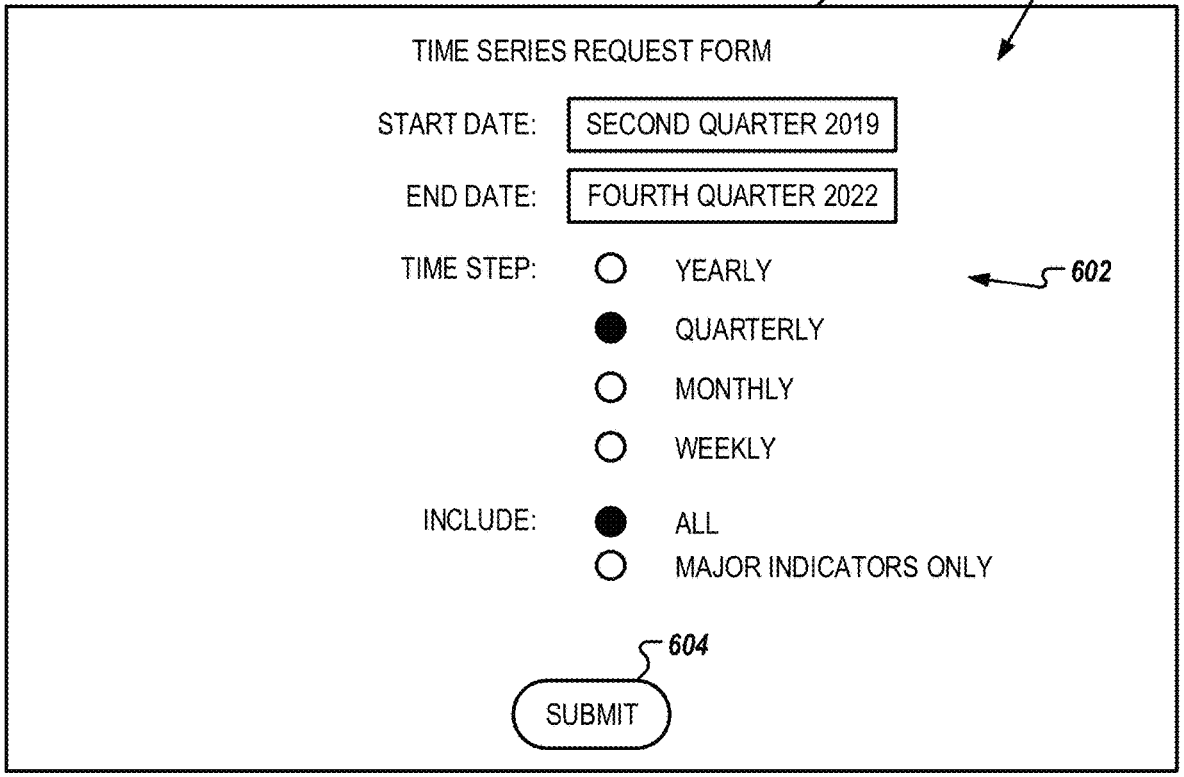
FIG. 6 illustrates an example IUI that may be used to cause the generation of a time series request, in an example embodiment described herein.

In an example embodiment, the request is automatically generated by the system computing device 10 (e.g., in response to a set and/or programmed trigger such as the end of the month, end of the quarter, end of the (fiscal) year, and/or the like). In various embodiments, the request is generated and provided by a user computing device 20 in response to user interaction with an interactive user interface (IUI) provided via the input-output circuitry 28 of the user computing device 20. For example, the user computing device 20 may provide a time series request IUI 600 via the input-output circuitry 28, an example version of which is provided in FIG. 6. For example, the user computing device 20 may execute application program code to provide the time series request IUI 600. In various embodiments, the application program code corresponds to a dedicated application; a browser used to access a portal, website, dashboard and/or the like (e.g., provided and/or hosted by the system computing device 10 and/or the like); or other application. In various embodiments, the time series request IUI 600 comprises one or more fillable and/or selectable series information/data fields 602. For example, the user may provide input (e.g., via input-output circuitry 28) to cause one or more fillable and/or selectable instrument information/data fields 602 to be populated by the user computing device 20. The user may then select (e.g., via input-output circuitry 28) a selectable submit element 604 (e.g., a submit button, icon, and/or the like) to cause the user computing device 20 to generate the time series request (e.g., based on the user selected and/or provided information/data) and provide (e.g., transmit) the time series request such that the system computing device 10 receives the time series request. For example, the user computing device 20 may comprise means, such as processor 22, memory 24, communications interface 26, input-output circuitry 28, and/or the like, for receiving user input (e.g., via a time series request IUI 600), generate a time series request, and provide the time series request.

At block 514, the one or more time series are generated and/or simulated. For example, the system computing device 10 may generate input information/data 412 based on the received time series request and provide and/or pass the input information/data 412 to the trained CCGAN 400. For example, the system computing device 10 may provide the information/data from the time series request to the time series simulator (e.g., the pre-processing module) for generation of the input information/data 412. In various embodiments, the input information/data 412 comprises at least one continuous conditional corresponding to at least one time step. For example, the input information/data 412 may include conditions y corresponding to time step to and including at least one continuous variable. The trained CCGAN 400 may then use the input information/data 412 to generate one or more time series. For example, the generator network 402 may receive the input information/data 412 via the input layer of the generator network 402. The input information/data may then be passed, from the input layer, through one or more hidden layers of the generator network 402, through to the output layer of the generator network 402. The output layer of the generator network 402 may then provide one or more instances of information/data of the time series.

In an example embodiment, the CCGAN 400 is configured to determine one instance of information/data of the time series at a time. For example, each instance of information/data of the time series may correspond to one time step. After generating and/or simulating a first instance of information/data of the time series corresponding to time $t_i$, the first instance of information/data of the time series may be stored (e.g., via memory 14) and/or provided (e.g., all of the first instance of information/data or a portion of the first instance of information/data) to the input layer of the generator network 402 for use in generating and/or simulating a second instance of information/data corresponding to time $t_{i+1}$. This process may be repeated until the instance of information/data corresponding to the time of the time series (e.g., $t_N$) is generated and/or simulated and possibly stored in memory 14. In various embodiments, portions of instances of information/data from multiple previous time steps may be provided as input (e.g., continuous conditions) to the CCGAN 400 for use in generating and/or simulating a next instance of information/data of the time series. For example, a post-processing module of the time series simulator may store each of the instances of information/data generated by the CCGAN and compile the instances of information/data into the simulated time series. For example, compiling the time series may include generating a time ordered series of the instances of information/data, filtering the elements of the instances of information/data based on the information/data of the time series request, and/or the like.

At block 514, after generating and/or simulating each of the instances of information/data of the time series indicated by the time series request, the one or more simulated time series and/or portions thereof may be provided. For example, the system computing device may provide the one or more simulated time series and/or portions thereof such that a user computing entity 20 receives the one or more simulated time series and/or portions thereof. In various embodiments, the one or more time series and/or portions thereof may be provided for display to a user (e.g., via an IUI provided via the input-output circuitry 28 of the user computing device 20), stored for later use (e.g., in memory 14, 24), provided as input to an analysis pipeline, and/or the like. In an example embodiment, the one or more simulated time series and/or portions thereof are provided as input to the analysis pipeline and a representation (e.g., graphical, tabular, and/or the like) of an output of the analysis pipeline is displayed to a user (e.g., via an IUI provided via the input-output circuitry 28 of the user computing device 20).

For example, the system computing device 10 may provide the one or more simulated time series and/or portions thereof such that the user computing entity 20 receives the one or more time series and/or portions thereof. For example, the system computing device 10 may comprise means, such as processor 12, memory 14, communications interface 16, and/or the like, for providing the one or more simulated time series and/or portions thereof such that the user computing entity 20 receives the one or more simulated time series and/or portions thereof.

Figure 7:
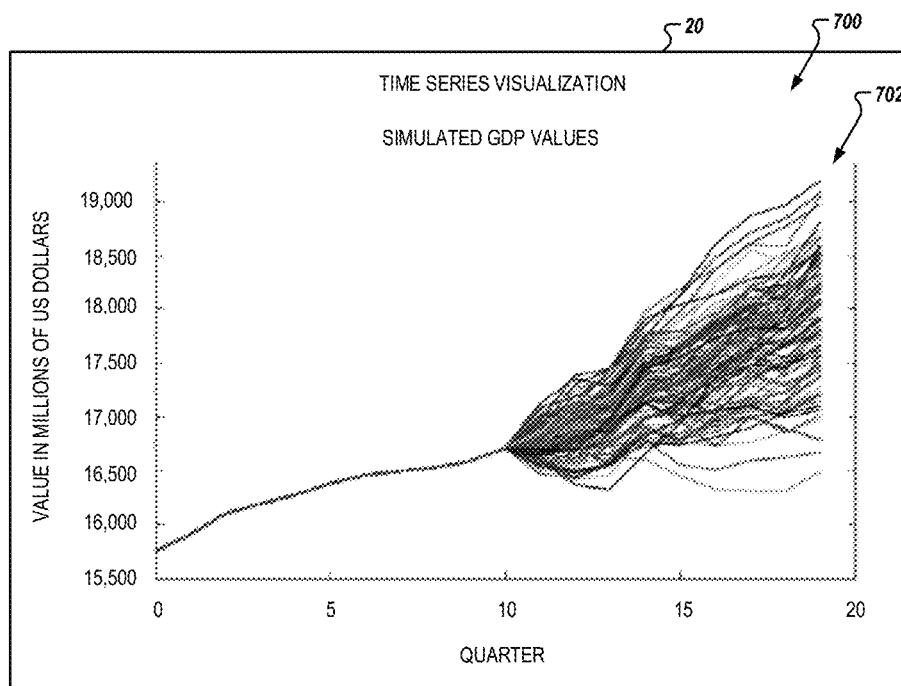
FIG. 7 illustrates some example simulated time series, according to an example embodiment described herein.

In various embodiments, the user computing device 20 receives the one or more simulated time series and/or portions thereof. For example, the user computing device 20 may comprise means, such as processor 22, memory 24, communications interface 26, and/or the like for receiving the one or more simulated time series and/or portions thereof. The user computing device 20 may register and/or processes the one or more simulated time series and/or portions thereof (e.g., via processor 22) and generate and/or render a representation of at least a portion of the one or more simulated time series and/or portions thereof. For example, a graphical and/or tabular representation of at least a portion of the one or more simulated time series may be generated and/or rendered. The representation of the at least a portion of the one or more simulated time series may then be provided (e.g., displayed) via the input-output circuitry 28 of the user computing device 20. For example, the user computing device 20 may execute application program code to provide a time series visualization IUI 700 via the input-output circuitry 28, an example version of which is shown in FIG. 7. In various embodiments, the application program code corresponds to a dedicated application; a browser used to access a portal, website, dashboard and/or the like (e.g., provided and/or hosted by the system computing device 10 and/or the like); or other application. As shown in FIG. 7, a time series visualization IUI 700 may comprise a representation 702 of at least a portion of the one or more simulated time series. For example, the representation 702 provides a graph of 100 forecasting paths of GDP generated by an example embodiment of a CCGAN using the most recent four-quarter historical values as the conditions (e.g., the input information/data 412). For example, the CCGAN 400 may be used to generate a plurality of different time series based on the most recent historical values as conditions (e.g., the input information/data 412). The plurality of time series may then be provided to analysis pipeline for use in a hypothetical shock analysis, analysis of the distribution of the plurality of time series to determine a most likelihood forecast and/or the likelihood of one or more scenarios, and/or the like. A representation of one or more of the plurality of simulated time series and/or a result of the analysis pipeline may be provided (e.g., displayed) via the time series visualization IUI 700, in various embodiments.

In an example embodiment, one or more simulated time series and/or the results of analyzing one or more simulating time series via an analysis pipeline (referred to as the simulated results herein) is used to validate one or more models. For example, the simulated results and/or a portion thereof may be provided to a model validation machine user that is a model validation module, application, program, and/or the like configured to compare at least a portion of the simulated results to model determined results to validate a forecasting model and/or the model results. For example, a forecasting model that is external to the CCGAN may generate model determined results that correspond to the simulated results generated via the CCGAN. For example, the model determined results may include values for one or more elements of the instances of information/data of the simulated time series and/or values corresponding to values generated by the analysis pipeline. The forecasting model may be part of a line-of-business (LOB) program package or may be another forecasting model that is otherwise separate from the CCGAN. In an example embodiment, the model validation machine user may comprise computer executable program code operating on the system computing device 10, a user computing device 20, and/or the like.

The model validation machine user compares one or more values of the model determined results and corresponding values of and/or determined from the simulated results to determine if the model determined results and the simulated results satisfy a similarity requirement. In an example embodiment, if the ratio one or more values of the model determined results to the corresponding values of and/or determined from the simulated results is within a defined range (e.g., 0.8 to 1.25, 0.85 to 1.17, 0.9 to 1.11, 0.95 to 1.05, 0.98 to 1.02, 0.99 to 1.01, and/or the like), it may be determined that the model determined results and the simulated results satisfy the similarity requirement. Similarly, if the ratio of one or more values of the model determined results to the corresponding values of and/or determined from the simulated results is not within the defined range, the model validation machine user may determine that the similarity requirement is not satisfied. In an example embodiment, if the absolute value of the difference between the one or more values of the model determined results and the corresponding values of and/or determined from the simulated results or the absolute value of the difference between the one or more values of the model determined results and the corresponding values of and/or determined from the simulated results divided by some value (e.g., the value from the model determined results or the corresponding value of and/or determined from the simulated results) is less than a threshold value, it may be determined that the similarity requirement is satisfied. Similarly, if the absolute value of the difference between the one or more values of the model determined results and the corresponding values of and/or determined from the simulated results or the absolute value of the difference between the one or more values of the model determined results and the corresponding values of and/or determined from the simulated results divided by some value (e.g., the value from the model determined results or the corresponding value of and/or determined from the simulated results) is not less than the threshold value, the model validation machine user may determine that the similarity requirement is not satisfied.

When the similarity requirement is satisfied, the model validation machine user may cause the simulated results to be stored, a log to be updated indicating that the similarity requirement was satisfied, and/or the like. When the similarity requirement is not satisfied, the model validation machine user may cause the simulated results to be stored, a log to be updated indicating that the similarity requirement was not satisfied, generate and cause an alert to be provided (e.g., via the IUI of the user computing device 20, via an email, instant message, and/or the like), and/or otherwise provide feedback to one or more human users or other machine users that the similarity requirement was not satisfied. In an example embodiment, providing the alert includes causing a representation of at least a portion of the simulated results and/or one or more values determined therefrom to be provided (e.g., displayed) via the input-output circuitry 28 of the user computing device 20, a representation of at least a portion of the model determined results to be provided (e.g., displayed) via the input-output circuitry 28 of the user computing device 20, an identification of the forecasting model that did not satisfy the similarity requirement, an indication that the similarity requirement was not satisfied, and/or the like, and/or various combinations thereof.

FIG. 5 illustrates a flowchart describing sets of operations performed by apparatuses, methods, and computer program products according to various example embodiments. It will be understood that each block of the flowcharts, and combinations of blocks in the flowcharts, may be implemented by various means, embodied as hardware, firmware, circuitry, and/or other devices associated with execution of software including one or more software instructions. For example, one or more of the operations described above may be embodied by software instructions. In this regard, the software instructions which embody the procedures described above may be stored by a memory of an apparatus employing an embodiment of the present invention and executed by a processor of that apparatus. As will be appreciated, any such software instructions may be loaded onto a computer or other programmable apparatus (e.g., hardware) to produce a machine, such that the resulting computer or other programmable apparatus implements the functions specified in the flowchart blocks. These software instructions may also be stored in a computer-readable memory that may direct a computer or other programmable apparatus to function in a particular manner, such that the software instructions stored in the computer-readable memory produce an article of manufacture, the execution of which implements the functions specified in the flowchart blocks. The software instructions may also be loaded onto a computer or other programmable apparatus to cause a series of operations to be performed on the computer or other programmable apparatus to produce a computer-implemented process such that the software instructions executed on the computer or other programmable apparatus provide operations for implementing the functions specified in the flowchart blocks.

The flowchart blocks support combinations of means for performing the specified functions and combinations of operations for performing the specified functions. It will be understood that one or more blocks of the flowcharts, and combinations of blocks in the flowcharts, can be implemented by special purpose hardware-based computer systems which perform the specified functions, or combinations of special purpose hardware and software instructions.

In some embodiments, some of the operations above may be modified or further amplified. Furthermore, in some embodiments, additional optional operations may be included. Modifications, amplifications, or additions to the operations above may be performed in any order and in any combination.

Technical Advantages

As these examples illustrate, example embodiments contemplated herein provide technical solutions that solve real-world problems faced during the generation of time series. Traditional means for generating time series, such as AR models, GARCH models, stochastic models, and/or the like are strongly dependent on model assumptions and estimation of the model parameters and, thus, are less effective in the estimation or generation of time series corresponding to non-Gaussian, skewed, and/or heavy-tailed distributions and/or distributions with time-varying dependence features. As described herein, a CGAN or CCGAN provides a non-parametric technique capable of learning dependence structures of time series and simulating conditional predictive time series, even for time series corresponding to non-Gaussian, skewed, and/or heavy-tailed distributions and/or distributions with time-varying dependence features. Additionally, the removal of the model assumptions allows for a more accurate determination of correlations (e.g., first order and/or second order) between various elements of the instances of information/data of the time series and/or determined based on the time series. For example, when a time series determined by traditional means is used, the correlation between two elements or parameters is set by the model assumptions rather than by the actual, real world relationship between the two elements or parameters. By generating and/or simulating the time series using the CCGAN, the correlation between the two elements or parameters represents the correlation between the two elements or parameters learned by the CCGAN based on training data used to train the CCGAN. Thus, using the CCGAN to generate and/or simulate time series provides a technical advantage over traditional time series generation techniques known in the art.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method for generating one or more time series, the method comprising:

generating, via a generator network of a continuous condition generative adversarial network (CCGAN) operating on a computing device, a time series based on input data comprising a continuous condition, wherein the time series is generated by the generator network based on a value of the continuous condition; and providing, via the computing device, the time series such that the time series is at least one of (a) available for input to an analysis pipeline or (b) received by a user computing device wherein a representation of at least a portion of the one or more time series is provided via an interactive user interface of the user computing device.

2. The method of claim 1, wherein the input data comprises a categorical condition.

3. The method of claim 2, wherein the categorical condition is a discrete condition that indicates a period of time corresponding to one or more time steps of the input data.

4. The method of claim 1, wherein generating the time series based on the input data comprises generating a plurality of instances of data, each instance of data corresponding to a time step, wherein to generate a second or subsequent instance of data corresponding to a subsequent time step, a value corresponding to a prior time step is used by the generator network as the continuous condition.

5. The method of claim 4, further comprising compiling the plurality of instances of data to form the time series.

6. The method of claim 5, wherein compiling the plurality of instances of data comprises filtering the time series based at least in part on the input data.

7. The method of claim 1, wherein the time series is one of two or more times series generated by the generator network based on the input data, wherein the two or more time series correspond to a plurality of possible scenarios.

8. The method of claim 1, wherein the continuous condition is determined based on historical data.

9. The method of claim 1, wherein the CCGAN is trained prior to generating the time series and training the CCGAN comprises clipping one or more weights of a discriminator network of the CCGAN.

10. The method of claim 1, wherein the generator network of the CCGAN comprises one or more hidden layers followed by application of a LeakyRelu activation function.

11. The method of claim 1, wherein the CCGAN comprises the generator network and a discriminator network that are collaboratively trained via a zero sum game.

12. The method of claim 1, wherein the CCGAN is trained to determine an element of the time series, wherein the determination is based at least in part on the value of the continuous condition.

13. An apparatus for determining an time series, the apparatus comprising:

processor circuitry configured to:

operate a generator network of a continuous condition generative adversarial network (CCGAN) to generate a time series based on input data comprising a continuous condition, wherein the time series is generated by the generator network based on a value of the continuous condition; and cause the time series to be provided such that the time series is at least one of (a) available for input to an analysis pipeline or (b) received by a user computing device wherein a representation of at least a portion of the one or more time series is provided via an interactive user interface of the user computing device.

14. The apparatus of claim 13, wherein the input data comprises a categorical condition.

15. The apparatus of claim 14, wherein the categorical condition is a discrete condition that indicates a period of time corresponding to one or more time steps of the input data.

16. The apparatus of claim 13, wherein generating the time series based on the input data comprises generating a plurality of instances of data, each instance of data corresponding to a time step, wherein to generate a second or subsequent instance of data corresponding to a subsequent time step, a value corresponding to a prior time step is used by the generator network as a continuous condition.

17. The apparatus of claim 16, wherein the processing circuitry is further configured to compile the plurality of instances of data to form the time series.

18. The apparatus of claim 17, wherein compiling the plurality of instances of data comprises filtering the time series based at least in part on the input data.

19. The apparatus of claim 13, wherein the time series is one of two or more times series generated by the generator network based on the input data, wherein the two or more time series correspond to a plurality of possible scenarios.

20. The apparatus of claim 13, wherein the CCGAN is trained prior to generating the time series and training the CCGAN comprises clipping one or more weights of a discriminator network of the CCGAN.

* * * * *